(12) United States Patent
Reents

(10) Patent No.: US 7,142,427 B2
(45) Date of Patent: Nov. 28, 2006

(54) BOTTOM SIDE HEAT SINK ATTACHMENT FOR CONSOLE

(75) Inventor: Jeffrey M. Reents, Carnation, WA (US)

(73) Assignee: Microsoft Corporation, Redmond, WA (US)

( * ) Notice: Subject to any disclaimer, the term of this patent is extended or adjusted under 35 U.S.C. 154(b) by 99 days.

(21) Appl. No.: 11/026,468

(22) Filed: Dec. 30, 2004

(65) Prior Publication Data

US 2006/0146499 A1 Jul. 6, 2006

(51) Int. Cl.
*H05K 7/20* (2006.01)
(52) U.S. Cl. .................. 361/704; 361/687; 361/697; 361/719; 165/80.3; 165/185; 174/16.3; 174/252; 245/505; 245/510
(58) Field of Classification Search ............ 361/687, 361/697, 704, 719, 690–694, 748–804, 816, 361/818, 709–710, 717–718; 165/80.3, 185; 174/16.3; 257/706–707, 712–713, 718–719, 257/726–727; 248/505, 510
See application file for complete search history.

(56) References Cited

U.S. PATENT DOCUMENTS

| | | | | |
|---|---|---|---|---|
| 5,847,928 A | * | 12/1998 | Hinshaw et al. | ............ 361/704 |
| 5,883,782 A | * | 3/1999 | Thurston et al. | ............ 361/704 |
| 5,883,783 A | * | 3/1999 | Turturro | ............ 361/704 |
| 6,008,990 A | * | 12/1999 | Liu | ............ 361/704 |
| 6,055,159 A | * | 4/2000 | Sun | ............ 361/704 |
| 6,304,445 B1 | * | 10/2001 | Bollesen | ............ 361/697 |
| 6,560,113 B1 | * | 5/2003 | Ma | ............ 361/719 |
| 7,042,727 B1 | * | 5/2006 | Ulen et al. | ............ 361/704 |
| 2005/0231918 A1 | * | 10/2005 | Goldmann | ............ 361/704 |

\* cited by examiner

*Primary Examiner*—Michael Datskovskiy
(74) *Attorney, Agent, or Firm*—Banner & Witcoff, Ltd.

(57) ABSTRACT

A system of mounting a heat sink to a processor in a console is provided. The processor is mounted on a first side of a PCB and the heat sink is mounted to the first side of the PCB so as to be in contact with the processor. A plurality of studs are mounted to the heat sink and extend through passageways in the PCB. A spring element is mounted to the studs on the second side of the PCB. A thrust plate is mounted to the spring element so that the spring element can press the thrust plate against the second side of the PCB. The spring element thus provides a force that aids in ensuring the heat sink and the processor are in tight contact. The studs can be attached to a housing via fasteners so the housing supports the heat sink rather than the PCB.

20 Claims, 9 Drawing Sheets

BOTTOM SIDE HEAT SINK ATTACHMENT FOR CONSOLE

BACKGROUND OF THE INVENTION

1. Field of the Invention

The present invention relates to the field of consoles, more particularly to the field of supporting a heat sink used to cool a console processor.

2. Description of Related Art

A modern computer processor, also known as central processing unit ("CPU"), tends to generate a fair amount of heat when in operation. The majority of this heat is caused by the electrical leakage of the transistors that make up a CPU. While attempts have been made to reduce the heat output of CPU's, in general the attempts have been unsuccessful.

The lack of success is because number of transistors on a CPU has increased from about 6000 transistors on an Intel® 8080 in 1974 to more than 50 million resistors on modern CPU's. The increase in the number of transistors (and the speed at which they work) has provided a significant increase in performance. Current CPU's are more than a 10000 times faster than the initial models. However, this increase is performance has come at a cost, a significant increase in thermal output.

When a transistor changes states, a small amount of electricity is leaked and this leakage generates heat. The decrease in the size of transistors has helped somewhat but the remarkable increase in the number of transistors and the speed of operation has overcome any reductions provided. Thus, a modern CPU, while about the size of a thumbnail, can be expected to generate more than 50 watts of heat and some CPU's generate more than a hundred watts of heat. With the relatively small size of the CPU, this heat generation has become a significant problem. A maximum die temperature for a silicon based CPU is somewhere in the range of 90 C, however a processor can be expected to have a relatively short life if operated at such a high temperature.

Therefore, given the fact that the modern CPU's will generate significant amounts of heat, some method is needed to remove the heat from the CPU so the CPU does not fail prematurely. As is known, there are three basic mechanisms for transferring heat, conductive heat transfer, convection heat transfer, and radiation heat transfer. Obviously, it would be preferable to not use a method that is extremely expensive or loud. Noise is especially important for consoles use to play games because background noise detracts from the immersive quality of a game.

One common method is to increase air flow across the CPU. By increasing the number of fans, it is possible to generate additional air flow and more quickly remove heat from the CPU. However, the generation of increased airflow has a drawback, additional noise is generated. Thus, while it is now common to include multiple fans to cool a CPU, it would be preferable to use lower speed fans.

In addition to increasing the flow of air over a CPU, it is has become standard practice to mount a heat sink to the CPU to help transfer heat away. As is known, a heat sink is tightly mounted to the CPU and the heat sink conducts the heat away from the CPU and air flow across the heat sink removes the heat via convection. Typically a CPU is attached to a substrate that is mounted to a printed circuit board ("PCB") and a heat sink is mounted to the CPU so that the heat generated by the CPU enters the heat sink and is conducted away. Typically the heat sink is mounted to the CPU via a frame that is mounted on the PCB and the frame/PCB combination supports the heat sink during a shock event. While heat sinks initially were made of aluminum, to improve conductivity, heat sinks are increasingly made of copper or other materials that are better conductors of heat than aluminum. In addition, heat sinks are usually designed with fins so that the heat transferred to the heat sink by conduction can be readily convected away from the heat sink by the flow of air across the fins.

To allow the heat sink to work effectively, however, it is necessary to tightly mount the heat sink to the CPU. Within reason, the tighter the connection, the better the heat transfer. To provide a tight connection, it is common for a heat sink to include a clip, typically made of plastic, which extends down the middle of the heat sink. The clip fastens the heat sink to the frame and ensures the heat sink and CPU remain under a compression load (i.e. have a tight connection). The clip is typically made of plastic and can provide a reasonable amount of force so as to ensure the heat sink is tightly held to the CPU. This has the unfortunate effect, however, of placing a relatively poor conductor (the plastic clip) over the hottest part of the heat sink. And even if the clip was made of metal it would still prevent the use fins across a portion of the surface of the heat sink.

In addition, mounting the heat sink to the frame that is supported by the PCB forces the PCB to support the mass of the heat sink. This can be problematic because if the console is dropped the PCB acts as spring damper for the heat sink and will tend to flex. Such flexing can cause the PCB to fail, especially when using leadless solder because leadless solder, while more environmentally friendly, tends to crack more readily than lead based solders. Thus, it would desirable to use a heat sink mounting system that can avoid placing excessive forces on the PCB while still allowing the heat sink to tightly press against the CPU.

Thus, while current systems of removing heat generated by the CPU have been somewhat effective at preventing the CPU and the surrounding components from failing prematurely due to heat or, additional improvements to the process are needed.

BRIEF SUMMARY OF THE INVENTION

In an embodiment, a CPU is mounted to a PCB. The CPU extends slightly above the surrounding electrical circuits mounted on the PCB. A heat sink is provided that mounts to the PCB. The heat sink includes a plurality of fasteners that extend through the PCB. A spring element attaches to the plurality of fasteners. The fasteners are then fastened to a housing via a second set of fasteners. The housing is configured to act as a Faraday cage and the housing supports the heat sink. The spring element is configured to exert a force on the underside of the PCB. The spring element includes a thrust plate, which can be fashioned of an insulating material, that is located between the spring element and the PCB and presses on the bottom of the PCB so as to exert a compressive load that forces the CPU and the heat sink to press together in a desirable fashion.

BRIEF DESCRIPTION OF THE DRAWINGS

The present invention is illustrated by way of example and not limited in the accompanying figures in which like reference numerals indicate similar elements and in which.

DETAILED DESCRIPTION OF THE INVENTION

Consoles for use as personal entertainment systems have a number of requirements. They must be capable of providing significant processing and graphic rendering capabilities to play the latest generation of games, thus a console requires a powerful processor.

In addition, a console must also be capable of withstanding the potential physical abuse caused by inadvertent dropping. For example, it is common for a cable to be used to connect a controller to a console and such a cable is frequently quite long in order, for example, to offer more freedom of movement and placement between the console and the controller. However, a problem occurs because an individual, a dog, a cat, or other pets can trip over the cable. Also, a pet may chew on and pull at the cable. In addition, from time to time, an individual may, without thinking carefully, try to tug on cable either to disengage it from, for example, the main console or to try to cause a certain action to take place in the game. In each of these cases, there is a danger that one or both of the console and the controller may be pulled by the force of, for example, tripping on, pulling on, or otherwise yanking on the cable. This can cause the console (which is commonly heavy, fragile, and/or expensive) to fall from its location onto the floor and become damaged.

Furthermore, it is desirable that a console generate a low level of noise so that the noise of operating the console does not interfere with entertainment being provided. In addition, it is desirable that a console take up a limited amount of space so as to not clutter up the entertainment area. Thus, consoles have significant requirements that generally exceed the requirements of a typical computer.

Figure 1:
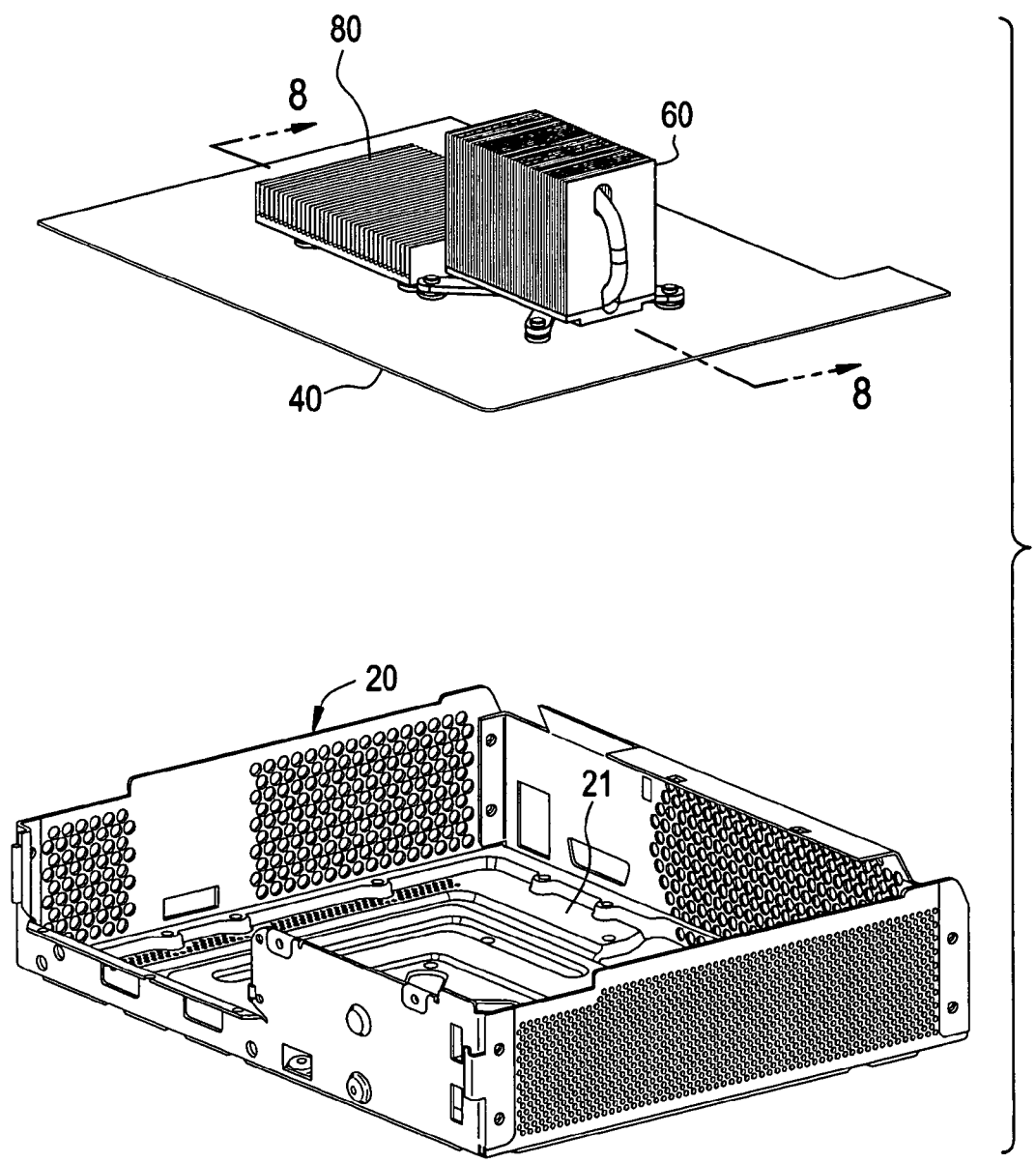
FIG. 1 illustrates an isometric exploded view of an embodiment of a PCB including heat sinks and a corresponding housing.

Turning now to FIG. 1, a partially exploded view of an embodiment of a console is shown. Housing 20 is configured in a manner that will be discussed in greater detail below to support printed circuit board ("PCB") 40. In an exemplary embodiment the housing 20 is a Faraday cage configured in a known manner to minimize the passage of electromagnetic waves therethrough.

As is typical, a number of components can be mounted to PCB 40, including a central processing unit ("CPU"), a graphic processing unit ("GPU"), and numerous other components known in the art of computer design. It should be noted that a GPU is basically a CPU dedicated to handling graphics, therefore the term GPU will be used to help differentiate between the different CPUs. Thus, it should be noted that while a console has special requirements not found in general purpose computers, a console is a state of the art computer and thus shares components with general computers such as might be used for home computing use. Accordingly, when assembled, PCB 40 is similar to a motherboard typically found in a general purpose computer.

Mounted on PCB 40 are a heat sink 60 and a heat sink 80. Heat sinks, in general, are sized according heat rejection requirements and heat transfer properties of the heat sink. As can be appreciated, the size of the heat sink 60 is greater than the size of the heat sink 80. Thus, while heat sink 80 is not small, heat sink 60 is quite a bit larger and can weigh about 290 grams. As depicted, no frame is used to support heat sink 60 or heat sink 80. In addition, as depicted no plastic clip is needed to mount heat sink 60 or heat sink 80 to the PCB. Thus, unlike typical heat sinks, the heat sink 60 and the heat sink 80 do not necessarily require a frame and do not necessarily require a plastic clip to hold the heat sink 60 or heat sink 80 to the frame or the PCB 40. As can be appreciated, this has the benefit of allowing for improved airflow across the heat sink while minimizing any insulation on the heat sink that might otherwise trap and reduce the ability of the heat sink to transfer heat away from the underlying components.

While only partially visible, the floor 21 of housing 20 includes a number of indentions and channels formed in it. While some of the shaped portions have other uses that will be discussed below, one benefit of the shape of the floor 21 is an increase in the stiffness and the strength of housing 20.

Figure 2:
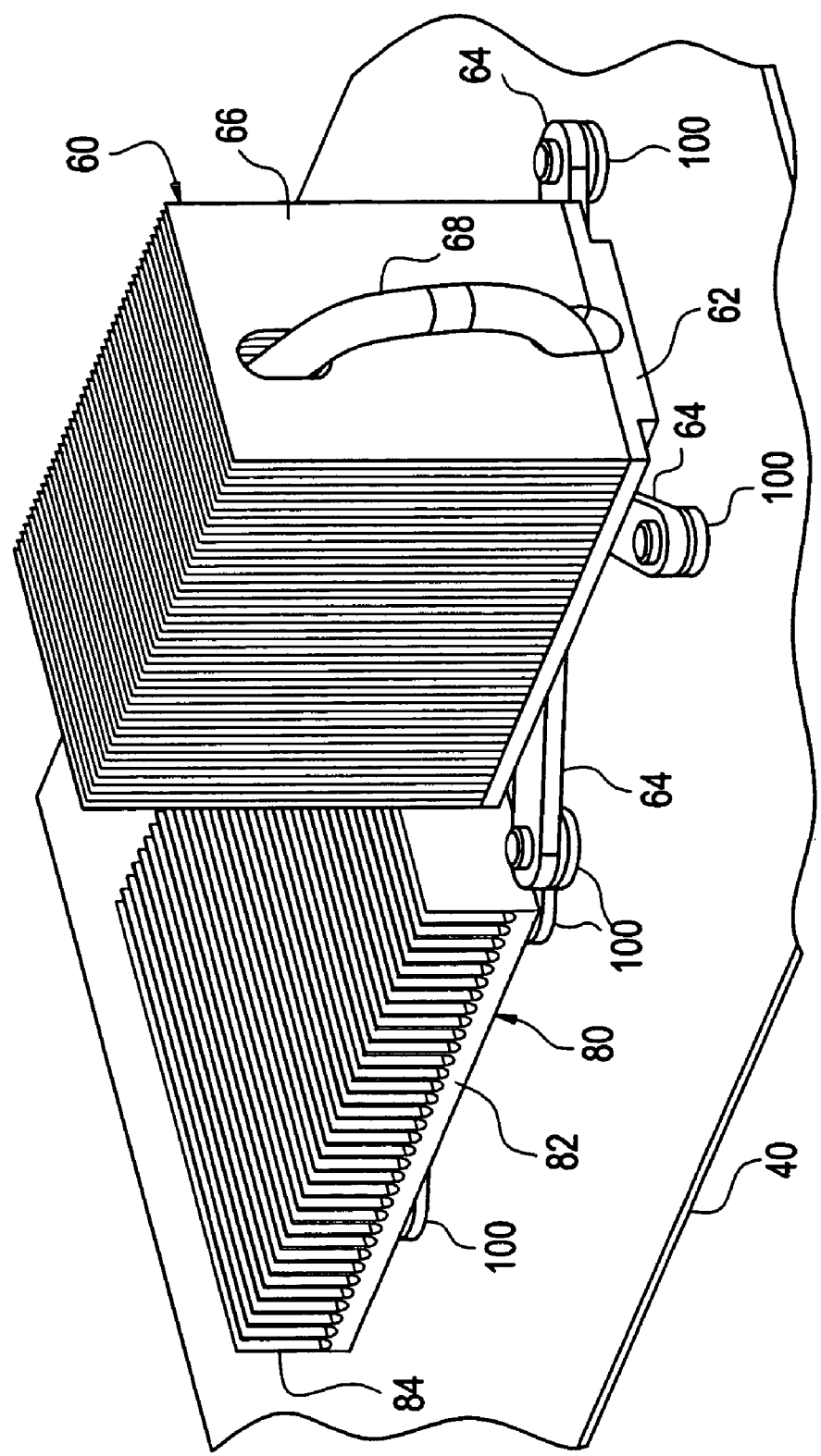
FIG. 2 illustrates an isometric partial view of the PCB depicted in FIG. 1.

Turning next to FIG. 2, a partial view of PCB 40 is provided. Heat sink 60 includes a base 62 from which four heat sink arms 64 extend (three of which are visible). Heat sink arms 64 are configured to mount to PCB 40 in manner that will be discussed below and support the heat sink 60. Heat sink 60 further includes a plurality of heat sink fins 66. As is known, heat sink fins can be provided in a variety of configuration that depend on the amount of heat that needs to be transferred away and the amount of air flow, among other things, directed across the heat sink. Typically heat sink fins extend away from the area where the heat originates. Heat sink 60 further includes a heat pipe 68. Heat pipe 68 can be vacuum sealed and include water to aid in the transfer of heat in a known manner. As depicted, heat sink 60 is configured so as to provide suitable heat transfer for a CPU generating at least 85 watts of heat.

Heat sink 80 is also mounted to PCB 40 in a manner similar to heat sink 60, however, heat sink 80 does not use arms to support the heat sink. Heat sink 80 includes a base 82 and a plurality of fins 84 extending from the base 82. As can be appreciated, the heat sink 80 is configured to transfer less heat away from the underlying components as compared to heat sink 60, for example heat sink 80 is suitable for transferring away around 40 watts of heat.

As depicted, between the PCB 40 and the heat sinks are a plurality of electromagnetic interference ("EMI") gaskets 100. EMI gaskets 100 may be collapsible. In an exemplary embodiment the PCB 40 will include exposed copper that will mate with the EMI gaskets 100 so that the EMI gaskets 100 can aid in grounding the CPUs and other components mounted on the PCB 40 to the housing 20. Thus, a potential benefit of the depicted embodiment is that the EMI interference can be reduced.

Figure 3:
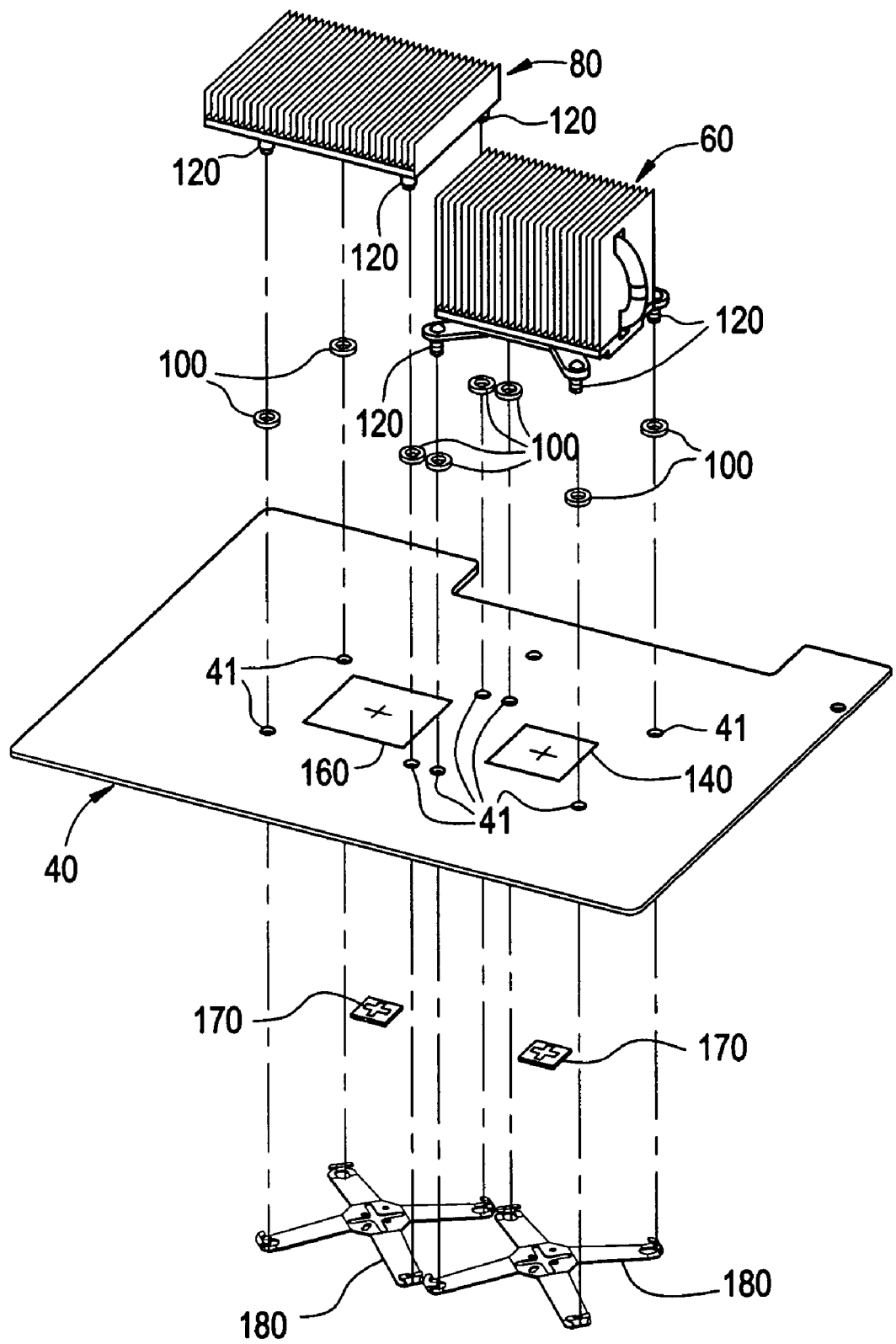
FIG. 3 illustrates an isometric exploded view of a PCB.

Turning next to FIG. 3, an exploded view of the assembly of the heat sinks to the PCB 40 is depicted. A plurality of passageways are provided in the PCB 40, the passageways being formed by holes 41 that defines the passageways in the PCB 40. In an exemplary embodiment, some exposed copper is configured about the holes 41 to aid in the EMI grounding. As shown, four EMI gaskets 100 support the heat sink 60 and four EMI gaskets 100 support heat sink 80. While the use of four mounting points has certain benefits that will be discussed below, it is also possible to use some other number of mounting points.

To support the heat sinks, four studs 120 are mounted on each of the heat sinks. Thus, heat sink 60 mounts on top of CPU 140 and heat sink 80 mounts on top of GPU 160. CPU 140 and GPU 160 are configured as bare die and GPU 160 is in a parent-daughter configuration. The studs 120 extend through the EMI gasket 100, through the passageways defined by holes 41 and interface with spring element 180 below the PCB 40 so as to keep the CPU 140 in tight contact with heat sink 60. Similarly, GPU 160 is kept in tight contact with heat sink 80. A known thermal compound can be placed between the heat sink and the CPU 140 and the GPU 160 to ensure efficient thermal energy transfer between the processors and the heat sinks.

It should be noted that the CPU and GPU could be combined into a single CPU. Alternatively, multiple CPU's could be included on a single die with a single heat sink configured to cool all the CPU's on the die. Furthermore, it is possible to include multiple CPU's (of which one or more may be dedicated to graphics) and only mount the heat sink to one of the CPU's. Numerous other alternatives will be apparent to one of ordinary skill in the art in light of this disclosure.

As mentioned above, within limits, the greater the force pressing the CPU or GPU against the respective heat sink, the better the heat transfer rate. Thus, it is desirable to have significant force holding the two components together. To provide this force, the spring element 180 presses up against plastic thrust plate 170. Thrust plate 170 presses against the underside of PCB 40, thus for example, pressing the CPU 140 on the exposed die against heat sink 60. In an exemplary embodiment, a clearance area without components is provided underneath PCB 40 so that thrust plate 170 can press against the bottom of PCB 40 without damaging components that may otherwise be mounted to the bottom of PCB 40. For example, when installed spring element 180 can exert 20 pounds of force on the bottom of PCB 40 that will cause the CPU 140 die to remain in tight contact with the heat sink 60. Similarly, a spring element 180 mounted below heat sink 80 can cause the GPU 160 to remain in tight contact with heat sink 80 by providing a similar level of force. Naturally, other levels of force can be provided as desired.

Figure 4:
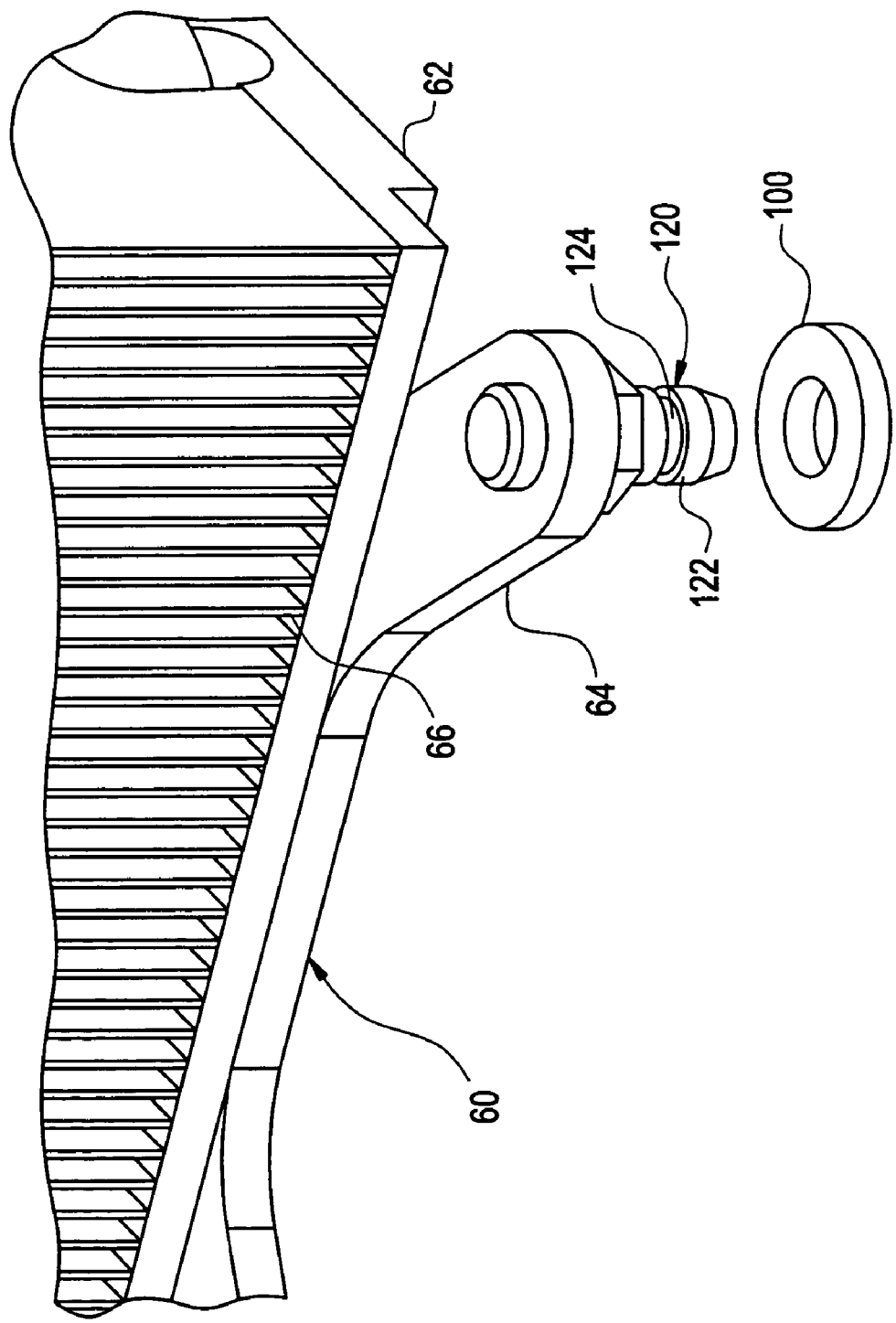
FIG. 4 illustrates an isometric view of a portion of the heat sink depicted in FIG. 1.

Turning to FIG. 4, an isometric view of the arm 64 extending from base 62 of heat sink 60 is depicted. A stud 120 is mounted in arm 64 and, while numerous materials are possible, the stud can be made of cold rolled steel with a tin plating. The stud 120 can include threads and be attached to arm 64 via the interface of corresponding threads. Alternatively, stud 120 can be configured without threads so as to be installed via a press-fit such that the friction of the interface between stud 120 and arm 64 holds the stud 120 in place. As depicted, stud 120 includes a shoulder 122 and an associated valley 124. The valley 124 and shoulder 122 are configured to mate to the spring element 180 in a manner discussed below.

Thus, heat sink 60 is mounted via four arms 64 that extend out from the base of the heat sink. The use of arms provides several benefits. One benefit is that an arm can be lighter and easier to package than a heat sink with a wider base. Thus, while the mass of heat sink 60 is greater than the mass of heat sink 80, except for the arms 64 the heat sink 60 has a smaller footprint. Furthermore, the heat pipe 68 is more effective if a certain amount of height is provided because the heat pipe 68 is useful in ensuring heat near the base of the heat sink 60 is transfer towards the upper portion of the heat sink so that the fins can be more effective in transferring heat. The arms 64, by extending outward, also help to provide stability, thus allowing for a taller package. This stability of the mounting system is further enhanced with the use of four arms as compared to the use three arms. The arms 64 further allow for a uniform sized spring element because different sized heat sinks can be provided with different sized arms so that the same spring element can be used, thus manufacturing costs can be reduced. Thus, different sized heat sinks can be mounted via the same fastening system if the appropriate arms are mounted to the base, assuming the base is not large enough.

Heat sink 80, having to remove less heat in order to keep the GPU 160 at the desired temperature, can be kept shorter and wider because the normal transfer of heat through the base and the fins is sufficient to cool the GPU 160. In addition, the heat sink 80 can be made of a less expensive material such as aluminum while the heat sink 60 will probably require a more expensive but better conducting material such as copper. As depicted, the footprint of heat sink 80 is large enough that arms are not required. One potential benefit of using a shorter heat sink is the ability to package other components above the heat sink.

Typically it is necessary to mount a fan on the heat sink used to transfer heat away from the CPU, especially the modern CPU's that generate more that 50 watts of heat. In other words, typically substantial forced convection is needed. This requirement is based on part on the fact that air flow provided by the fans not mounted on the CPU is not used efficiently. The requirement is also based on the fact that the heat sink is mounted via a frame and or plastic clips that diminish the effectiveness of the heat sink. While an embodiment of the present invention does not require mounting a fan directly to the heat sink 60, some air flow across the heat sink is required as radiation heat transfer is generally insufficient to cool a reasonably sized heat sink. Thus, it would be beneficial to provide forced convention by directing air across the heat sinks and out of the console so that sufficient heat rejection is provided. It may even be desirable to provide a fan shroud, which can be made of plastic to direct air over the heat sinks before being forced out of the console by one or more fans. The use of a shroud thus allows for more efficient use of air flow and can provide a substantial increase in cooling for a given air flow. With regards to fans, it may be desirable to use two or more fans because increasing the number of fans allows for the use of a lower speed fan, which typically is quieter than a comparable higher speed fan.

Figure 5:
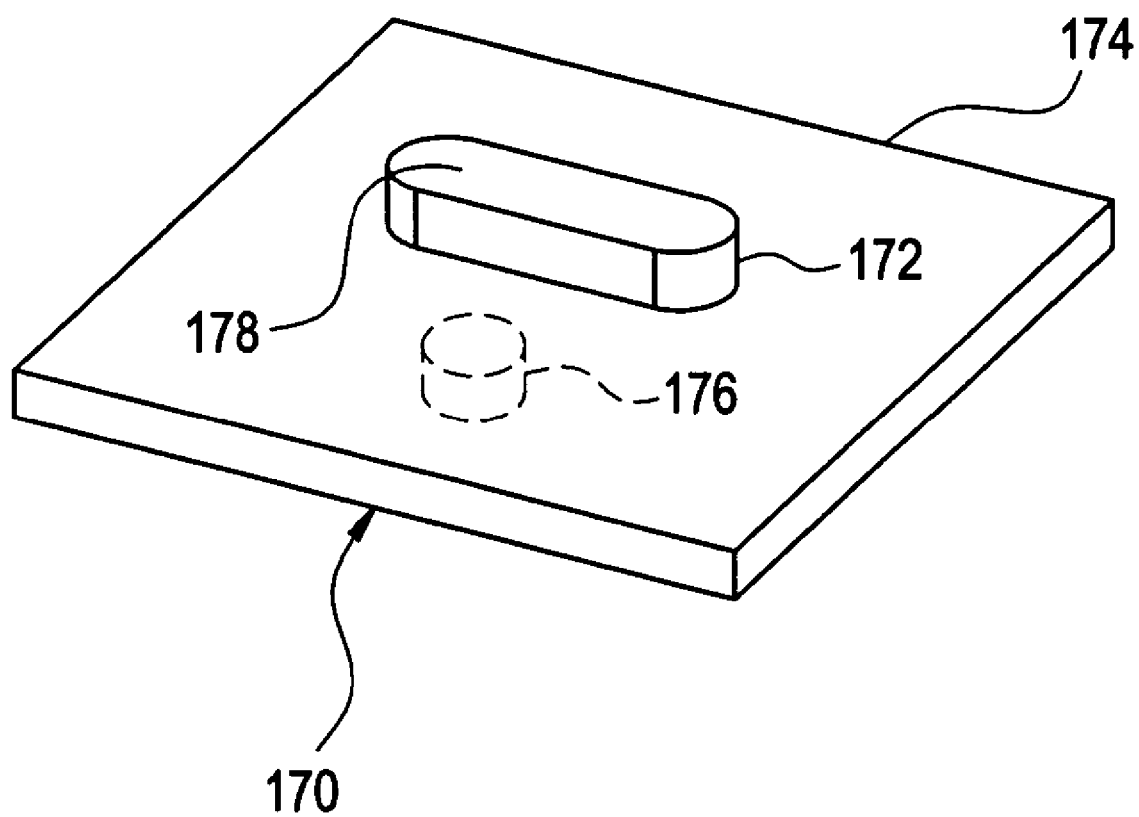
FIG. 5 illustrates an isometric view of a thrust plate depicted in FIG. 3.

Turning to FIG. 5, an isometric view of the thrust plate 170 is depicted. Thrust plate 170 includes an extension 172 mounted to a thrust plate base 174. In operation, the mounting surface 178 of extension 172 is pressed against the underside of the PCB 40, as indicated in FIG. 3. Thrust plate 170 can be made of a plastic such as LEXAN® and in an exemplary embodiment includes a pattern 176, shown in dotted line, that mates with a corresponding feature in spring element 180. The shape and the quantity of the pattern 176 is not critical, however it is beneficial to provide some sort of pattern on thrust plate 170 so that the thrust plate 170 can be properly located on the spring element 180. In an exemplary embodiment, the pattern 176 will hold the thrust plate in the desired location. Thus, if the pattern 176 is shaped like a cylinder, it may be beneficial to use 2 patterns 176 to ensure the orientation of the thrust plate 170 remains fixed with regards to the spring element 180.

It can be beneficial to place components on the underside of PCB 40. Naturally, the use of a stiffening plate or some other support structure mounted to the bottom of PCB 40 would normally make the placement of such components impossible. However, if a clearance space is provided that matches the shape of extension 172, the thrust plate 170 can exert a force on the bottom of the PCB 40 while still providing a space so that components can be mounted outside of the clearance area. In an embodiment, the thrust plate extension 172 extends above the thrust plate base 174 by about 2 mm so that some space for the mounting of components is provided. Naturally, if the overall package of allows for additional space, the thrust plate extension 172 can be extended further so as to provide more than 2 mm of space. While it is possible to provide less space as well, it can be difficult to package some components in less that 2 mm of space.

Figure 6:
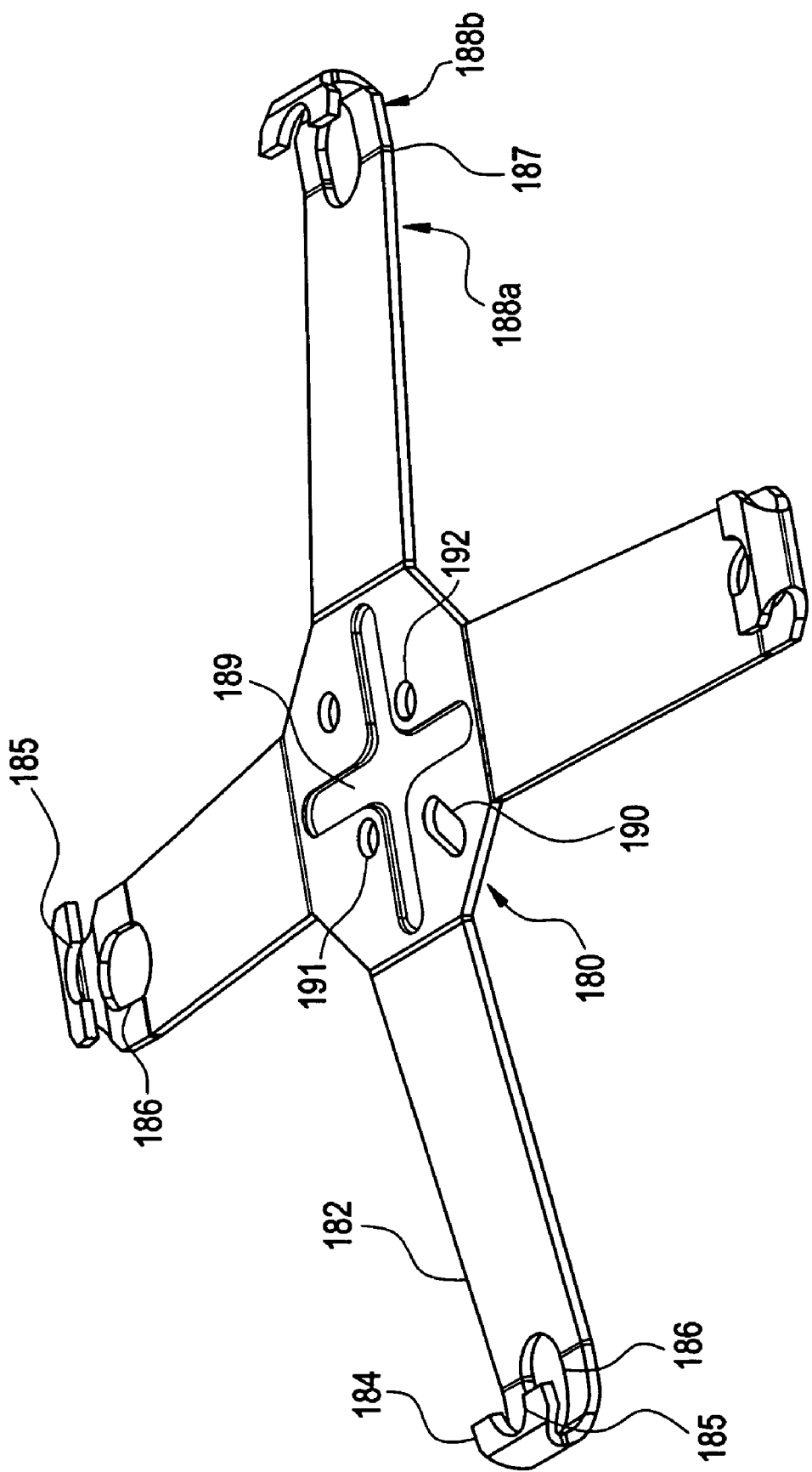
FIG. 6 illustrates an isometric view of a spring element as depicted in FIG. 3

Turning now to FIG. 6, a spring element 180 is depicted. Spring element 180 can be made of three-quarters hard stainless steel and can be 2 mm thick. Naturally, variations in material properties and the thickness of the spring element can be used, depending on the packaging requirements. However, the above configuration can be effective if a relative small space, such as 4 mm, is available. As depicted, spring element includes four spring arms 182 that extend out and curve up into a fork 184 that includes a notch 185. Fork 184 and notch 185 are configured to engage valley 124 and shoulder 122 of stud 120.

Thus, when studs 120, mounted to the heat sinks, are extended through PCB 40, the fork 184 and notch 185 are installed on the corresponding studs 120. In order to ensure a proper fit, one method of installation is to install two arms 182 of the spring element 180 on two studs 120. The other two arms, however, are prevented from being installed by fact that fork 184 and notch 185 lack sufficient clearance to be simply installed on the remaining two studs 120. However, by exerting a force at the point 188*a* on the arms 182, the arms 182 will bend near the secondary bending point 187. This bending will cause the fork 184 to pivot outward and downward near point 188*b* and allow for the installation of fork 184 and notch 185 onto the shoulder 122 and valley 124 of stud 120. In an alternative method of assembly, all four arms can be pressed at point 188*a* simultaneously with the use of a press.

Thus, in general, spring element 180 includes a central region from which a plurality of arms extend radially, the arms configured to mate to the studs extending from the heat sink and passing through the PCB. As depicted the arms are about 90 degrees apart, thus each arm is configured to provide an equal amount of spring force and the force being applied by each is not overly concentrated. At the same time the spring element 180 avoids utilizing an unnecessarily large number of arms that would make packaging the components on the PCB more difficult. While having four arms is advantageous because of the symmetry of the spring, some other number greater or less than 4 is also possible. Reducing the number of arms has the disadvantage of requiring the use a stronger arm design to provide the same level of force.

Referring again to FIG. 6, stiffening bead 189 is provided in the center region of the spring element 180. Stiffening bead 189 is configured to provide stiffening to the spring element 180. However, pattern 176 of thrust plate 170 can potentially be configured to fit in indention 189 so that the position of thrust plate 170 is controlled. Alignment hole 190 can also be used to ensure the orientation of thrust plate 170 is proper if a corresponding feature is provided in thrust plate 170. Alternatively, hole 191 and hole 192 can define passageways in spring element 180 that will mate with a plurality of patterns 176 in thrust plate 170 so as to prevent thrust plate 170 from shifting when installed. Numerous other methods of ensuring alignment of the thrust plate 170 to the spring element 180 will occur to persons of ordinary skill in the art.

Thrust plate 170 can be mounted on spring element 180 so that the orientation of the extension 172 is controlled during installation of the spring element to the studs. Naturally, it is also possible to install thrust plate 170 without concern for alignment if suitable clearance is provided on the bottom of PCB 40 for receiving thrust plate extension 172. In an alternative embodiment, the thrust plate 170 is simply mounted on spring element 180 and than the orientation of spring element 180 is controlled during installation onto the studs 120 so that the orientation of extension 172 of thrust plate 170 matches the clearance area provided on the underside of PCB 40.

Once the spring element 180 is installed on the four corresponding studs 120, a substantial amount of force will press the CPU 140 up against the base 62 of heat sink 60. In an embodiment, the force will be in the range of about 20 lbs (about 90 newtons). This helps ensure the heat sink 60 is tightly fitted to the CPU 140 so as to provide efficient heat transfer away from the CPU 140. In an exemplary embodiment, the cooling system will be configured to keep the junction temperature of the CPU 140 below 85 degrees Celsius.

Similarly, the GPU 160 will be pressed against the base 82 of heat sink 80 with a force of about 20 pounds. In an exemplary embodiment, the junction temperature of the GPU 160 will be kept below 105 degrees Celsius.

Naturally, the required heat transfer and maximum junction temperature requirements will vary depending on, among other things, the materials used to manufacture the processor and the capabilities and speed of the processor. Other things being equal, a slower processor will produce less heat but will also have less processing power. However, to provide immersive games with, for example, powerful artificial intelligence and attractive graphics, it is typically necessary to use a powerful processor. Therefore, it is beneficial to provide a processor that is powerful and provide a suitable heat transfer system to enable the processor to work.

As noted above, the heat sinks could be mounted via three studs 120 rather than four studs 120. In such an embodiment, where spring element comprised three arms, it might be necessary to increase the thickness of spring element 180 to something greater than 2 mm so as to provide the necessary compression force so that a CPU and a heat sink could be pressed together tightly. Alternatively, a stronger material might be used for spring element 180. Other potential variations such as adding additional stiffening features to the spring element 180 are also envisioned. Assuming there is sufficient packaging space, a number of variations can be tried until an embodiment is obtained that provides the desired force at the desired cost. While the use of two studs is also possible, such a design would require additional stabilizing structure that would be less desirable. Of course, increasing the number of studs 120 to more than four is also possible but packaging the components that mount to the PCB around the five or more passageways may be difficult if space is an issue.

Figure 7:
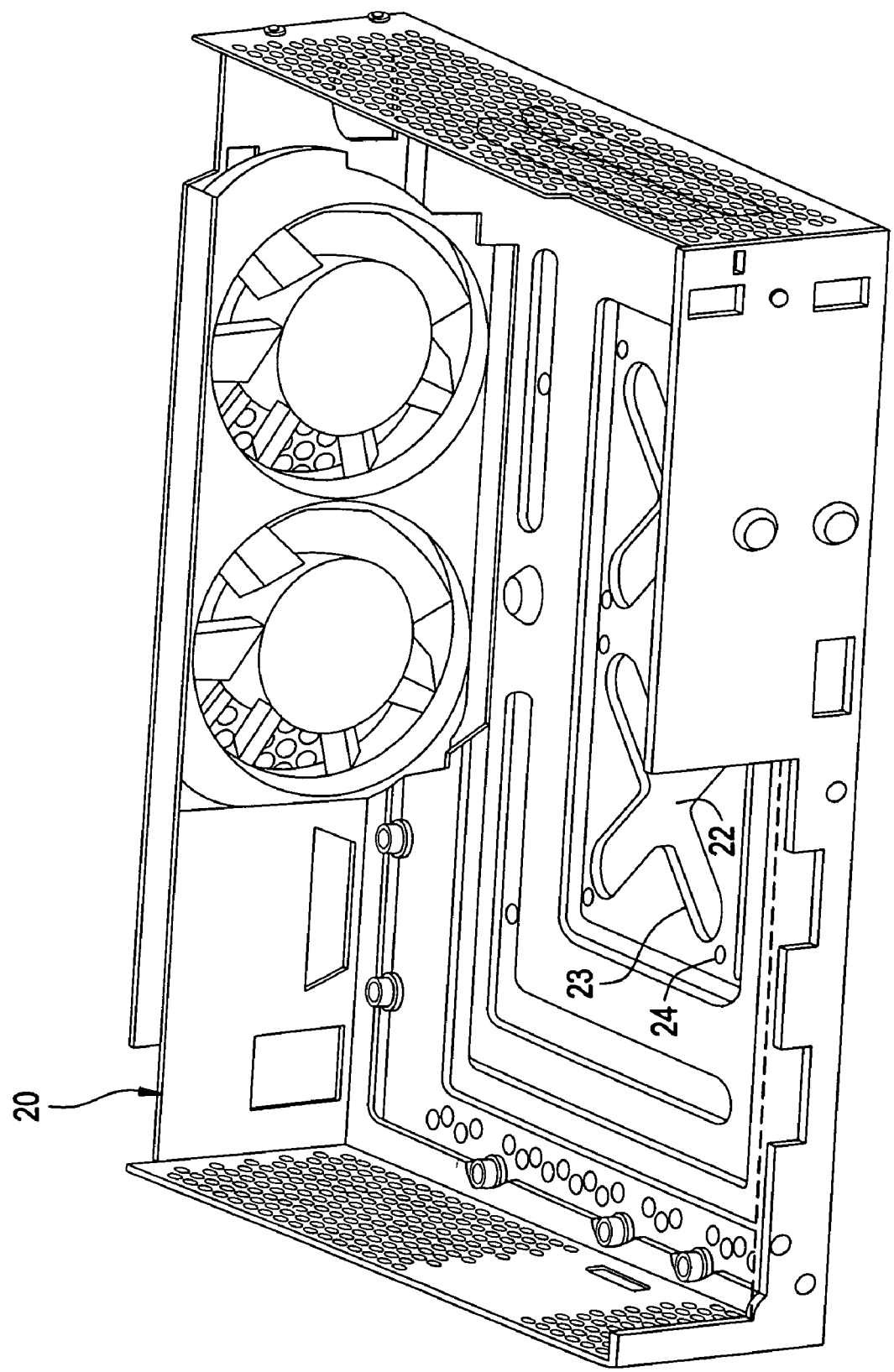
FIG. 7 illustrates an isometric view of the housing depicted in FIG. 1.

Turning next to FIG. 7, housing 20 is depicted. Housing 20 can be made of steel and includes a floor 21 that includes indentions 22 that correspond to the spring elements 180.

After the spring element 180 is mounted to the studs 120, the PCB 40, including heat sinks and spring elements, is ready to be mounted to housing 20. As depicted above, spring element 180 included four arms 182. Thus, indention 22 includes four arm indentions 23 that correspond to the four arms 182 of spring element 180. At the end of each arm indention 23, a hole 24 is included in the housing 20 that defines a passageway through the housing 20. If the number of studs 120 and arms 182 changed, the housing 20 could be modified accordingly.

Thus, when the PCB 40 is installed, the studs 120 that extend from the heat sinks and through the PCB 40 are aligned with the passageways formed by the holes 24. The holes 186 of spring element 180 are also aligned with the passageways formed in the housing 20 by holes 24. Accordingly, a fastener can be inserted from the underside of housing 20 into the stud 120 so as to secure the studs 120 and the attached heat sinks to the housing 20. Furthermore, the four distal ends of the arms 182 of spring element 180 are in contact with the housing 20. This contact between the spring element 180 and the housing 20 provides for beneficial EMI grounding of the heat sink and the components mounted on the PCB 40 (such as the CPU 140 and the GPU 160).

Figure 8:
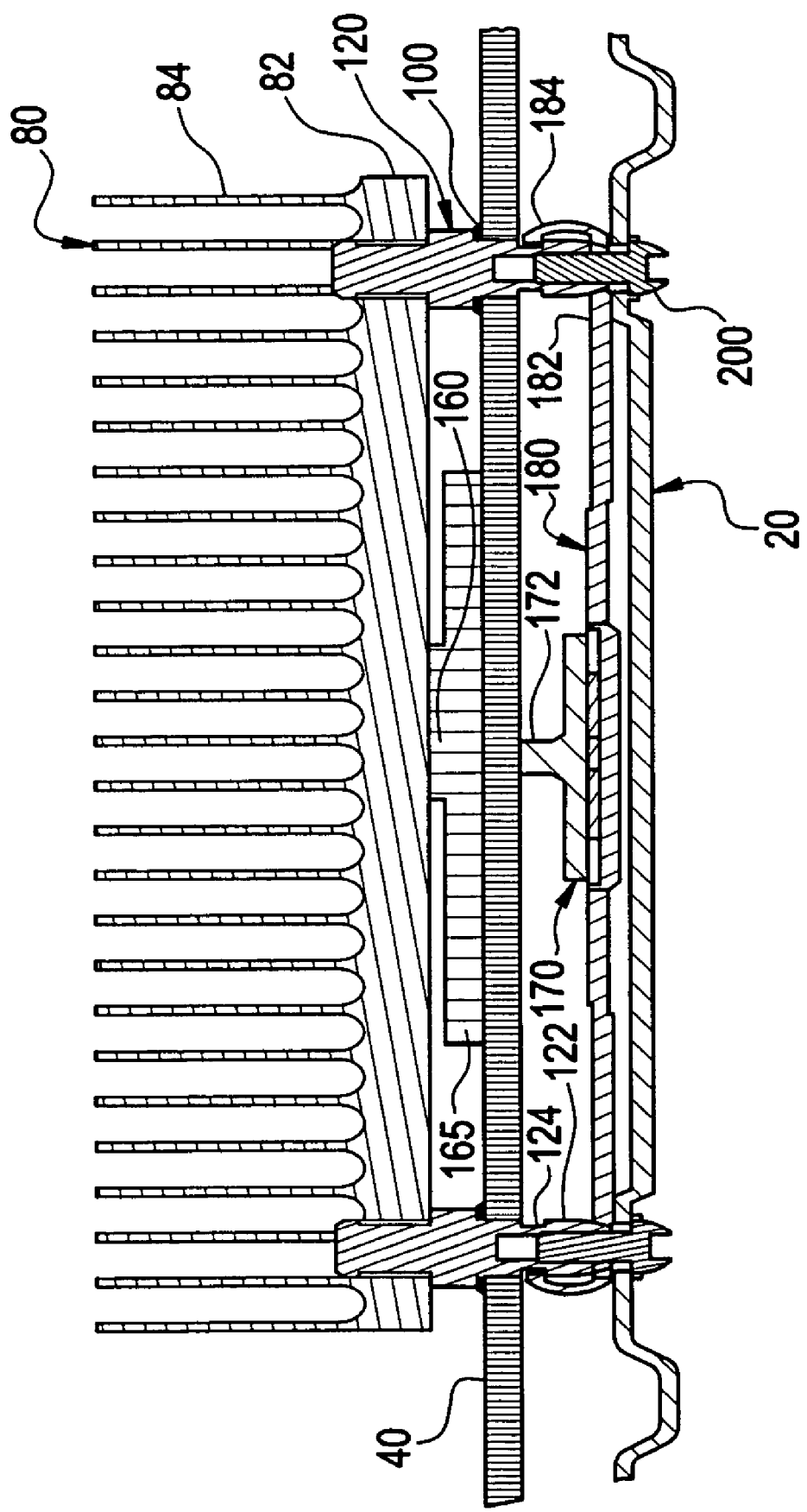
FIG. 8 illustrates a cross-section of one of the heat sinks depicted in FIG. 1, taken along the line 8—8.

Referring next to FIG. 8, a cross-section of an embodiment of PCB 40 assembled to the housing 20 is provided, taken along the line of 8—8 in FIG. 1. GPU 160 is mounted on a substrate 165 that is mounted on the top or first side of the PCB 40, as is typical for the mounting of a processor on a PCB. The base 82 of the heat sink 80 is tightly pressed against the GPU 160 so as to ensure effective heat transfer. Studs 120 are depicted as doubled sided studs that mount to the base 82 of the heat sink 80. The EMI gaskets 100, shown as being collapsible, are compressed between the studs 120 and the PCB 40. Thus, EMI gaskets 100 are situated between the heat sink 80 and the PCB 40.

The studs 120 extend through the passageways formed in the PCB 40 and extend away from the second or bottom side of the PCB. A spring element 180 is mounted on the studs 120 and a thrust plate 170 is mounted on the spring element 180. Thus, the upward force generated by the spring element 180 causes the extension 172 of thrust plate 170 to press against the second side of the PCB. This pressing on the second side of the PCB therefore causes the GPU 160 and the heat sink 80 to be tightly pressed together so that effective heat transfer between the GPU 160 and the heat sink 80 can take place.

Studs 120 include internal threaded diameters that are configured to accept a threaded fastener. Thus, a plurality of fasteners 200 are installed from the bottom of the housing 20 through the passageway defined by holes 24 in housing 20, the fasteners mating with the internal threaded diameter of the studs 120, and in the processes the fasteners 200 firmly mount the studs 120, the associated heat sinks and the spring element to the housing 20. Thus, as depicted, the heat sink 80 is supported by the housing 20 rather than the PCB 40. In an embodiment, eight fasteners 200 are provided to attach to the eight studs 120.

Of course, the design of stud 120 can be varied depending on how the housing 20 is attached to the stud 120. Thus, if the stud 120 was to be spot welded to the housing 20, stud 120 could be a solid without an internal threaded diameter and configured to be make direct contact with the housing 20. This would have the disadvantage, however, of not allowing for disassembly or rework. Naturally, it is also possible to mount stud 120 and spring element 180 to housing 20 without providing the EMI grounding, however such a design would be less beneficial.

As noted above, the spring element 180 is mounted to housing 20, thus spring element 180 is grounded. Therefore, it is generally desirable to use a thrust plate 170 that is an electrical insulator so as to avoid grounding the PCB 40 at locations that should not be grounded. Naturally, if the design of PCB 40 was modified so that EMI grounding was desired or permitted at the location where the thrust plate 170 mated with the PCB 40, the thrust plate 170 could be made of a conductive material or the spring element 180 could be configured to mate directly to the PCB 40 without the use of a thrust plate 170.

As depicted, a gap exists between the spring element 180 and the housing 20, thus the force exerted on the underside of the PCB 40 is provided by the spring element 180. This has the benefit of allowing a relatively fixed mounting of the heat sink 80 to the housing 20 via the stud and fastener connection while providing a controlled force to the bottom of the PCB 40 to ensure a tight fit between the GPU 160 and the base 82 of the heat sink 80. Thus, during a vibration input, the housing 20 could flex to absorb some of the vibration and the spring element 180 could provide secondary vibration absorption capabilities. Thus, the GPU 160 is supported by a spring force provided by both the housing 20 and the spring element 180 and is therefore somewhat protected from vibration inputs. In addition, the mounting system depicted in FIG. 8 helps keep the PCB 40 flat which beneficially aids in preventing undesirable flexing of PCB 40.

As can be appreciated, housing 20 can be mounted inside a housing (not shown) and the housing can be the outside portion of the console. When the console is subjected to a vibration input or if the console is dropped, the momentum of heat sink 60 and heat sink 80 can cause the floor 21 of housing 20 to deflect. Thus, the mounting system depicted in FIG. 8 has the mass of the heat sink supported by the relatively strong floor 21 of housing 20 rather than the PCB 40. This has the benefit of providing support during, for example, an accidental drop of the console. Thus, the PCB 40 is isolated from unwanted shocks and forces. Accordingly, when the console is dropped, the mass of the heat sink 60 will move based on the deflection of the floor 21 of housing 20. This flexibility avoids undesirable stress concentrations during a sudden vibration such as an accidental drop and thus makes the console more robust. In addition, the design helps to dampen out vibration that would otherwise be applied to the PCB, which can be particularly useful if lead-free solder is used on the PCB.

While it is important that the console not break due to forces exerted by the end user, the manufacture also needs the console to be robust so that the console can handle the forces exerted on the console during shipping. One potential advantage of the improved mounting system depicted in FIG. 8 is that it is possible to reduce the amount of packaging needed to protect consoles during shipping. This can have the benefit of increasing the number of consoles that can fit on a pallet, which can provide a substantial cost savings depending on the number of consoles being sold.

Furthermore, it is common for a retail store to devote a certain amount of space to a particular brand. A smaller package will allow additional consoles to fit within a given space, thus helping to ensure that a retail store does not run out of consoles because more console can fit in the space provided. Alternatively, the reduced packaging size may make it possible to provide more space for accessories and games. Thus, numerous benefits can potentially be realized when the heat sink is mounted to the housing 20 rather than the PCB 40.

It should be noted that while the embodiment depicted in FIG. 8 provides beneficial EMI grounding via the studs 120, the EMI gaskets 100, and the spring element 180, it may be desirable to provide additional EMI grounding. For instance, exposed copper can be provided along the perimeter of PCB 40 so that the perimeter is grounded to the housing 20. As depicted in FIG. 7, the floor 21 of housing 20 is indented so as to allow for components to be mounted on the underside of the PCB 40. Thus, it is possible for the PCB 40 to be supported along much of its perimeter and further supported in additional locations such as where studs 120 are mounted. This advantageously allows for sufficient EMI grounding to the housing 20 while maximizing package space on the second side of the PCB 40.

Figure 9:
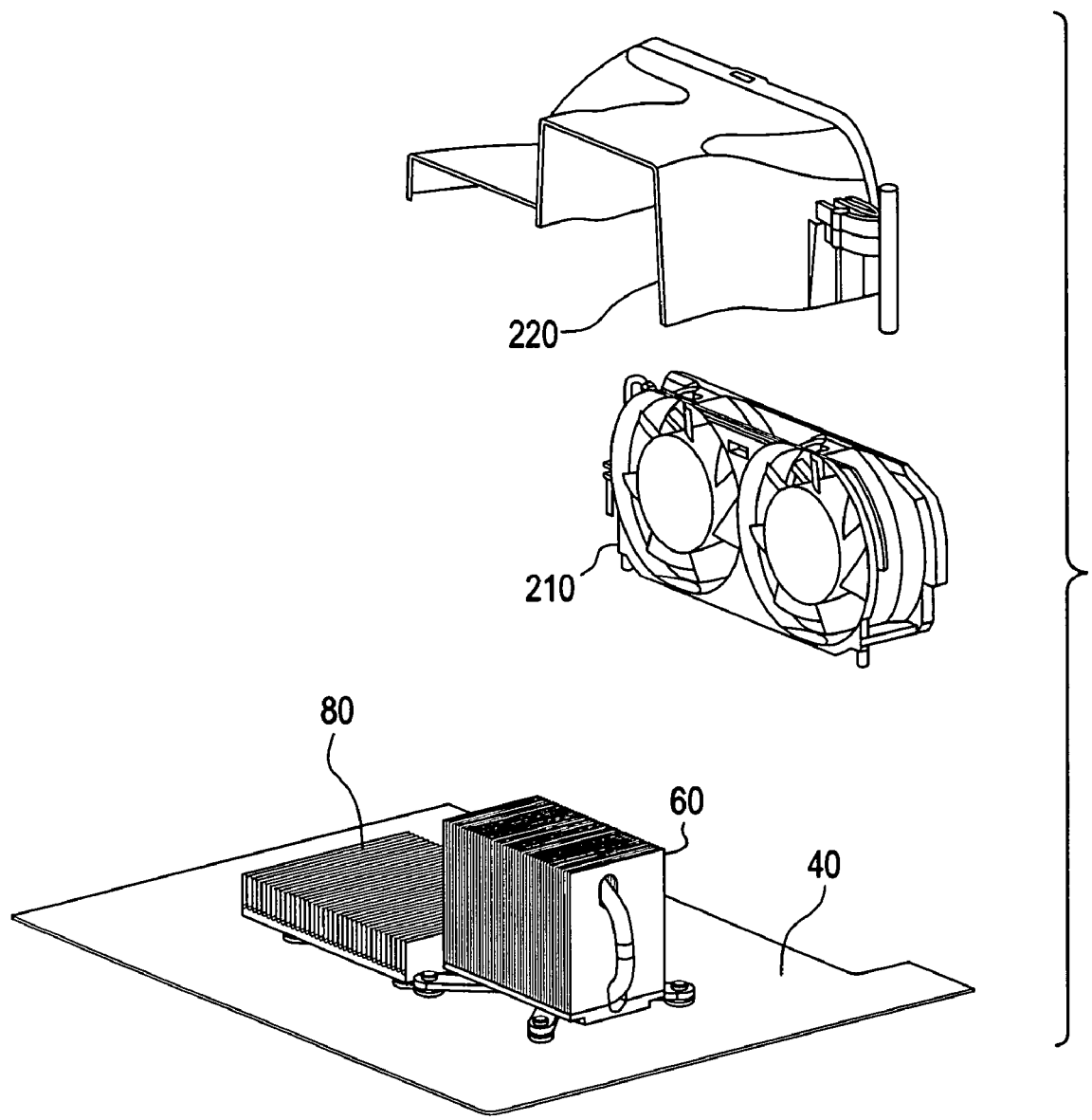
FIG. 9 illustrates an exploded isometric view of an embodiment of a cooling system for use with an embodiment of a PCB.

Turning to FIG. 9, the heat sink 60 and heat sink 80 are cooled by a fan system 210. The air flow generated by the fan system 210 is directed through a shroud 220. In an embodiment, the fans system 210 pulls air through the shroud 220 and across the heat sink 60 and heat sink 80. Thus, air enters the console through various air passageways and passes various components in the process. The air is warmed up somewhat by the components but is still cooler than the heat sinks. The warm air is than directed across the heat sinks and the constriction caused by the shroud 220 causes the velocity of the air flow to increase, thus benefiting the heat transfer rate. Upon exiting the heat sink 60 and heat sink 80, the air is hot and thus it is beneficial to direct the hot air out of the console, which the fan system 210 does. In this method, it is possible to cool all the other components provided in the console while still cooling the heat sinks with the use of the single fan system 210.

The present invention has been described in terms of preferred and exemplary embodiments thereof. Numerous other embodiments, modifications and variations within the scope and spirit of the appended claims will occur to persons of ordinary skill in the art from a review of this disclosure.

I claim:

1. A system for mounting a heat sink to a CPU located on a first side of a PCB, comprising:
    a plurality of holes on the PCB, the holes defining passageways through the PCB;
    a plurality of studs mounted to the heat sink, the plurality of studs extending through the PCB via the passageways defined in the PCB;
    a spring element mounted to each of the plurality of studs on a second side of the PCB;
    a thrust plate mounted on the spring element, the thrust plate configured to press against the second side of the PCB, whereby the spring element exerts a force on the thrust plate that causes the thrust plate to press against the second side of the PCB, thereby causing the CPU to press tightly against the heat sink; and
    a plurality of EMI gaskets mounted to the plurality of holes of the PCB, the plurality of EMI gaskets located between the PCB and the heat sink, wherein the plurality of studs extend through the plurality of EMI gaskets.

2. The system of claim 1, further comprising a housing, wherein the plurality of studs are attached to the housing so that the housing supports the heat sink.

3. The system of claim 1, wherein the thrust plate includes a thrust plate base and a thrust plate extension, the thrust plate extension providing clearance between the thrust plate base and the PCB so that, in operation, components can be mounted to the second side of the PCB proximate the thrust plate base.

4. The system of claim 1, wherein the heat sink includes a base and a plurality of arms extending from the base, and the plurality of studs are mounted to the plurality of arms extending from the heat sink base.

5. A system for mounting a heat sink to a CPU located on a first side of a PCB, comprising:
    a plurality of holes on the PCB, the holes defining passageways through the PCB;
    a plurality of studs mounted to the heat sink, the plurality of studs extending through the PCB via the passageways defined in the PCB;
    a spring element mounted to each of the plurality of studs on a second side of the PCB;
    a thrust plate mounted on the spring element, the thrust plate configured to press against the second side of the PCB, whereby the spring element, exerts a force on the thrust plate that causes the thrust plate to press against the second side of the PCB, thereby causing the CPU to press tightly against the heat sink;
    wherein the heat sink includes a base and a plurality of arms extending from the base, and the plurality of studs are mounted to the plurality of arms extending from the heat sink base.

6. The system of claim 5, wherein the thrust plate includes a thrust plate base and a thrust plate extension, the thrust plate extension providing clearance between the thrust plate base and the PCB.

7. The system of claim 6, wherein the thrust plate is made of a plastic material and includes a feature for mating with a corresponding feature on the spring element, and the heat sink is made of copper.

8. A system for mounting a heat sink to a CPU located on a first side of a PCB, comprising:
    a plurality of holes on the PCB, the holes defining passageways through the PCB;
    a plurality of studs mounted to the heat sink, the plurality of studs extending through the PCB via the passageways defined in the PCB;
    a spring element mounted to each of the plurality of studs on a second side of the PCB;
    a thrust plate mounted on the spring element, the thrust plate configured to press against the second side of the PCB, whereby the spring element exerts a force on the thrust plate that causes the thrust plate to press against the second side of the PCB, thereby causing the CPU to press tightly against the heat sink;
    a housing, wherein the plurality of studs are attached to the housing so that the housing supports the heat sink; and
    plurality of EMI gaskets mounted to the plurality of holes of the PCB, the EMI positioned between the heat sink and the PCB so that the studs extend through the center of the EMI gaskets.

9. The system of claim 8, wherein the housing includes a plurality of holes that define passageways through the housing, and the plurality of studs include internal threaded diameters, the system further comprising a plurality of fasteners, the plurality of fasteners extending through the passageways formed in the housing to mount to the internal threaded diameters and attach the plurality of studs to the housing.

10. The system of claim 9, wherein the thrust plate includes a thrust plate base and a thrust plate extension, the thrust plate extension providing clearance between the thrust plate base and the PCB so that, in operation, components can be mounted to the second side of the PCB without being damaged by the thrust plate.

11. The system of claim 10, wherein there are four studs mounted to the heat sink, wherein the spring element includes four arms extending radially from a center region, the four arms configured to mount to the four studs, each of the four arms includes a hole in a distal portion of the arm, each of the holes aligned with each of the studs.

12. A method of mounting a heat sink having a plurality of studs to a CPU installed on a first side of a PCB, comprising the steps of:
inserting the plurality of studs through a plurality of holes in the PCB, the holes defining passageways in the PCB;
mounting a spring element to the plurality of studs extending through the PCB so that the spring element causes a force to be exerted on a second side of the PCB that causes the CPU to be pressed tightly against the heat sink;
attaching the plurality of studs to a housing so that the housing supports the heat sink;
providing a thrust plate on the spring element, wherein the spring element presses the thrust plate against the PCB; and
wherein the step of attaching the plurality of studs to the housing includes the steps of:
aligning the plurality of studs to a plurality of holes in the housing; and attaching the plurality of studs to the housing with a plurality of threaded fasteners configured to mate with an internal threaded diameter on the plurality of studs.

13. The method of claim 12, further comprising the step of providing an EMI gasket between the PCB and the heat sink so as to provide EMI ground to the PCB.

14. A console for providing home entertainment: comprising;
a housing;
a PCB including a plurality of holes configured to form passageways through the PCB, the PCB having a first side and a second side;
a processor mounted on the first side of the PCB;
a heat sink mounted on the first side of the PCB, the heat sink configured to connectively mate with the processor;
a thrust plate configured to press on the second side of the PCB opposite the processor;
a plurality of studs, the studs mounted to the heat sink and extending through the passageways formed in the PCB, the plurality of studs attached to the housing; and
a spring element mounted on the plurality of studs adjacent the second side of the PCB, the spring element configured to exerting a force on the thrust plate; whereby the housing supports the studs and the associated heat sink and the spring element exerts a force on the thrust plate such that the processor and the heat sink are tightly connected; and
a plurality of EMI gaskets for providing EMI grounding, the EMI gaskets situated between the heat sink and the PCB.

15. The console of claim 14, further comprising a plurality of fasteners configured to attach the plurality of studs to the housing.

16. The console of claim 15, wherein the heat sink is made of copper and includes a heat pipe.

17. The console of claim 14, wherein the heat sink is cooled without the mounting of a fan on the heat sink.

18. The console of claim 17, further comprising a fan system for generating an air flow and a shroud for controlling the air flow.

19. The console of claim 14, wherein the thrust plate is made of a plastic material.

20. The console of claim 14, wherein the heat sink includes a base and a plurality of arms extending from the base, and the plurality of studs are mounted to the plurality of arms extending from the heat sink base.

* * * * *